United States Patent
Jung

(10) Patent No.: US 7,303,963 B2
(45) Date of Patent: Dec. 4, 2007

(54) METHOD FOR MANUFACTURING CELL TRANSISTOR

(75) Inventor: Te O Jung, Seoul (KR)

(73) Assignee: Hynix Semiconductor Inc., Gynnggi-do (KR)

( * ) Notice: Subject to any disclaimer, the term of this patent is extended or adjusted under 35 U.S.C. 154(b) by 0 days.

(21) Appl. No.: 11/039,243

(22) Filed: Jan. 18, 2005

(65) Prior Publication Data
US 2005/0277261 A1 Dec. 15, 2005

(30) Foreign Application Priority Data
Jun. 14, 2004 (KR) .................... 10-2004-0043701

(51) Int. Cl.
H01L 21/336 (2006.01)
H01L 21/76 (2006.01)

(52) U.S. Cl. ...................... 438/294; 438/413

(58) Field of Classification Search ........ 438/292–296, 438/413, 424
See application file for complete search history.

(56) References Cited

U.S. PATENT DOCUMENTS

| | | | |
|---|---|---|---|
| 5,223,447 A | 6/1993 | Lee et al. | |
| 6,693,018 B2 | 2/2004 | Kim et al. | |
| 6,852,559 B2 * | 2/2005 | Kwak et al. | 438/44 |
| 6,858,490 B2 * | 2/2005 | Kim | 438/239 |
| 2004/0126987 A1 | 7/2004 | Kim | |

* cited by examiner

*Primary Examiner*—Hsien-Ming Lee
(74) *Attorney, Agent, or Firm*—Marshall, Gerstein & Borun LLP

(57) ABSTRACT

Disclosed herein is a method of manufacturing a cell transistor which can achieve an improvement in a short-channel effect of a cell transistor as well as an improvement in a refresh characteristic of the transistor, and can also prevent a reduction in the threshold voltage of the transistor, in relation to DRAM memory cells with high integration. The method comprises the steps of forming a device isolation region, which defines a device separating region, on a silicon substrate, forming a barrier layer on the substrate formed with device isolation region, forming a hard mask, which defines a gate forming region, on the substrate formed with the barrier layer, forming a silicon epitaxial layer on a surface of the substrate through selective epitaxial growth of silicon constituting the surface of the substrate, formed with the hard mask and the barrier layer, and removing the hard mask.

17 Claims, 3 Drawing Sheets

METHOD FOR MANUFACTURING CELL TRANSISTOR

BACKGROUND OF THE INVENTION

1. Field of the Invention

The present invention relates to a method of manufacturing a cell transistor, and more particularly to a method of manufacturing a cell transistor which can achieve an improvement in a short-channel effect of a cell transistor as well as an improvement in a refresh characteristic of the transistor, and can also prevent a reduction in the threshold voltage of the transistor, in relation to DRAM memory cells with high integration.

2. Description of the Related Art

Under current reduction in design rule of semiconductor devices caused by the high integration density of DRAM memory cells, cell transistors are increasingly reduced in size and channel length. Such a reduced channel length exacerbates a short-channel effect of the transistors, thereby causing a reduced threshold voltage and a deterioration in a refresh characteristic of the DRAM memory cells.

Recently, in order to solve the above problem, a transistor having a recess gate has been studied.

Considering a conventional method of manufacturing the transistor having a recess gate, first, a device isolation region is formed on a silicon substrate where in the substrate is separated into an active region and device isolation region. Then, a mask, which defines a gate forming region, is formed on the substrate in the active region. By using the mask as an etching mask, the silicon substrate is etched by a predetermined thickness to form trenches. After etching completion, a general gate forming process is performed on the trenches of the substrate, thereby achieving a gate pattern. Here, the gate pattern comprises a gate oxide film, a gate electrode, and a hard mask. In order to protect the resulting gate pattern from certain subsequent processes, such as etching and washing processes, finally, insulating spacers are formed at side walls of the gate pattern.

As stated above, in the transistor having the recess gate manufactured according to the prior art, as a result of forming the trenches having a predetermined depth in the silicon substrate to be located in the gate forming region of the active region, there is achieved a channel lengthened along the profile of the trenches, thereby minimizing the generation of a short-channel effect due to the high integration of a semiconductor device.

However, the above described trench forming manner has a difficulty since the etching of the trenches must be selectively performed on a specific portion corresponding to the gate forming region among the active region of the silicon substrate without damage to the device isolation region, which divide the silicon substrate into the device separating region and the active region. As a result, a pointed silicon protrusion is formed on the substrate adjacent to the device isolation region. The silicon protrusion expands an electric field, resulting in a deterioration in the refresh characteristic of the DRAM memory cells.

SUMMARY OF THE INVENTION

Therefore, the present invention has been made in view of the above problems, and it is an object of the present invention to provide a method of manufacturing a cell transistor which can achieve an improvement in a short-channel effect of a cell transistor caused by high integration as well as an improvement in a refresh characteristic of the transistor, and can also prevent a reduction in the threshold voltage of the transistor.

In accordance with an aspect of the present invention, the above and other objects can be accomplished by the provision of a method of manufacturing a cell transistor comprising the steps of: a) forming device on a silicon substrate; b) forming a barrier layer on the substrate formed with device isolation region; c) forming a hard mask, which defines a gate forming region, on the substrate formed with the barrier layer; d) forming a silicon epitaxial layer on a surface of the substrate through selective epitaxial growth of silicon constituting the surface of the substrate, which was formed with the hard mask and the barrier layer; and e) removing the hard mask.

Preferably, the barrier layer may be made of an oxide-based material and has a thickness in a range of 100 to 2000 Å, and the hard mask may be made of a nitride-based material and has a thickness in a range of 100 to 2000 Å, in order to restrict the lateral growth of a silicon epitaxial layer when the silicon epitaxial layer is formed to have a thickness in a range of 100 to 2000 Å through selective epitaxial growth.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
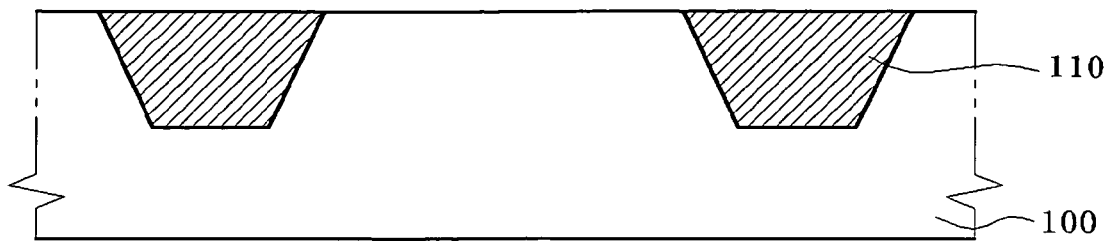
FIGS. 1a to 1g are front sectional views illustrating a sequential steps of a method for manufacturing a cell transistor in accordance with an embodiment of the present invention.

Hereinafter, a preferred embodiment of the present invention will be explained in detail with reference to the accompanying drawings so as to allow those skilled in the art to easily carry out the present invention. However, it should be understood that the present invention can be embodied in a variety of different manners, rather than being limited to the embodiment described herein.

In the drawings, respective layers of a transistor cell according to the present invention are shown at an enlarged scale in order to clearly describe their regions, and similar parts are denoted by the same reference numerals throughout the specification.

Now, a method of manufacturing a cell transistor in accordance with an embodiment of the present invention will be explained in detail with reference to the accompanying drawings.

FIGS. 1a to 1g are front sectional views illustrating sequential processes of the transistor cell manufacturing method in accordance with the embodiment of the present invention.

Referring first to FIG. 1a, by making use of a device isolation region forming process, such as for example, shallow trench isolation (STI) process, a device isolation region 110 is formed in a substrate 100. The device isolation region 110 divides the substrate 100 into a device separating region and an active region.

Figure 1B:
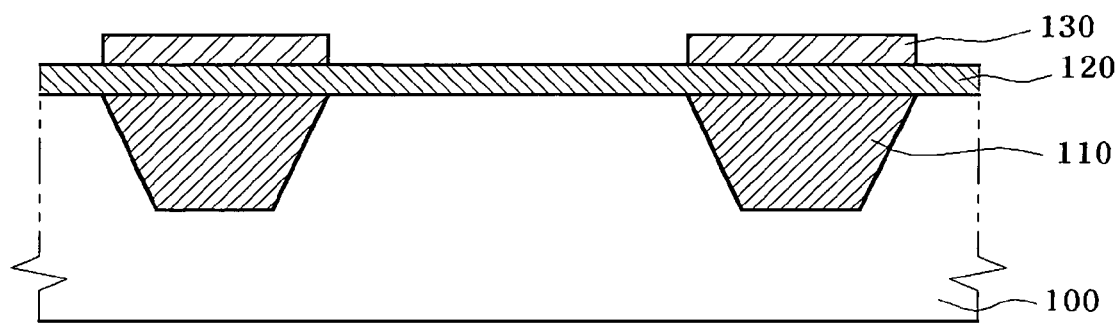
Figure 1C:
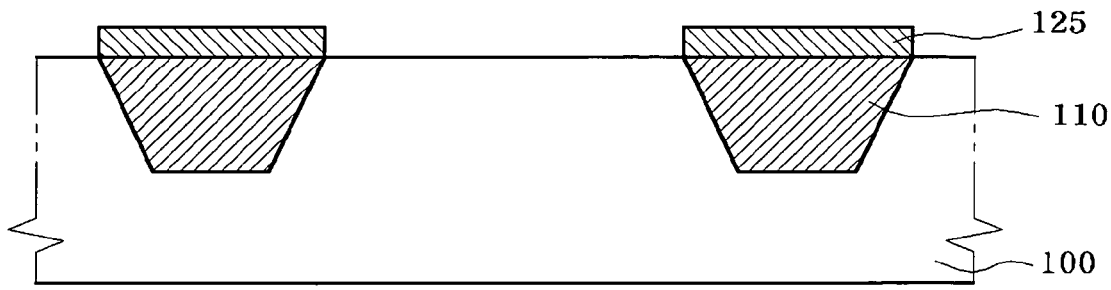

Next, as shown in FIG. 1b, an oxide-based material, such as for example, LP-TEOS, HDP, and USG, is deposited throughout a top surface of the substrate 100 in a thickness from 100 to 2000 Å to form an oxide film 120.

In succession, a first photosensitive film pattern 130, which defines a barrier layer forming region for protecting the device separating region, is formed on the oxide film 120. By using the first photosensitive film pattern 130 as an etching mask, the oxide film 120 is selectively etched, thereby forming a barrier layer 125 made of an oxide-based material. In this case, the barrier layer 125 is located on the device isolation region 110, which defines the device separating region of the substrate 100, and serves to prevent lateral growth of silicon toward the device separating region in a selective epitaxial growth process of the silicon, which will be described hereinafter.

Figure 1D:
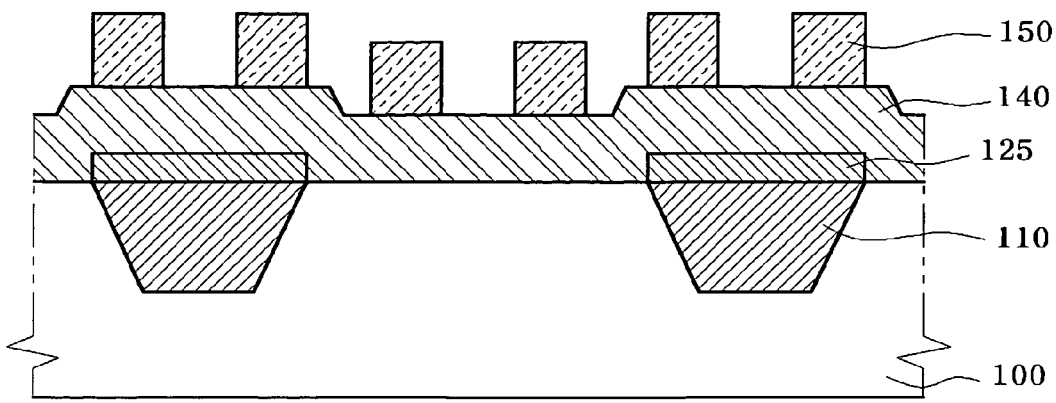

Referring to FIG. 1d, a nitride-based material is deposited to a thickness from 100 to 2000 Å throughout the surface of the silicon substrate 100 formed with the barrier layer 125 to form a nitride film 140, and on the nitride film 140, in turn, is formed a second photosensitive film pattern 150, which defines a gate forming region.

Figure 1E:
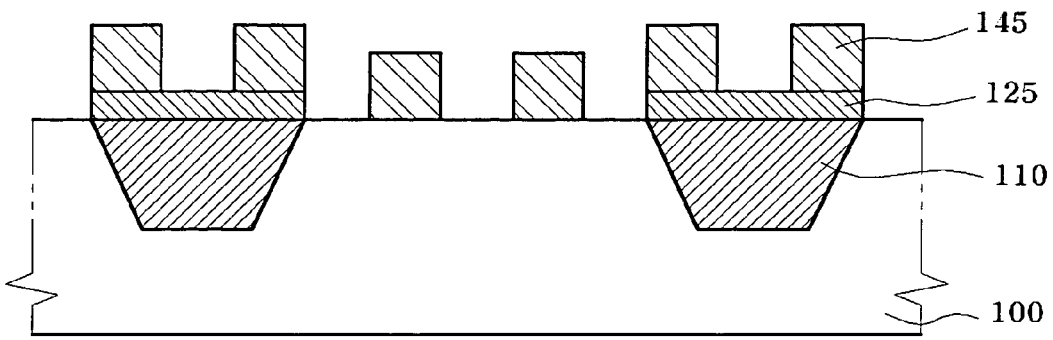

After that, as shown in FIG. 1e, the nitride film 140 is selectively etched by means of the second photosensitive film pattern 150 as an etching mask to form a hard mask 145. In this case, the hard mask 145 is located on the substrate over both the device isolation region and the active region, and defines a gate forming region. Especially, part of the hard mask 145 located on the active region is shaped to define the profile of trenches ensuring the length of a gate channel. More particularly, the hard mask 145 on the top surface of the substrate 100 has a thickness of 100 to 2000 Å. This allows the trenches, which will be formed in a subsequent process, to have a depth of 100 to 2000 Å.

Figure 1F:
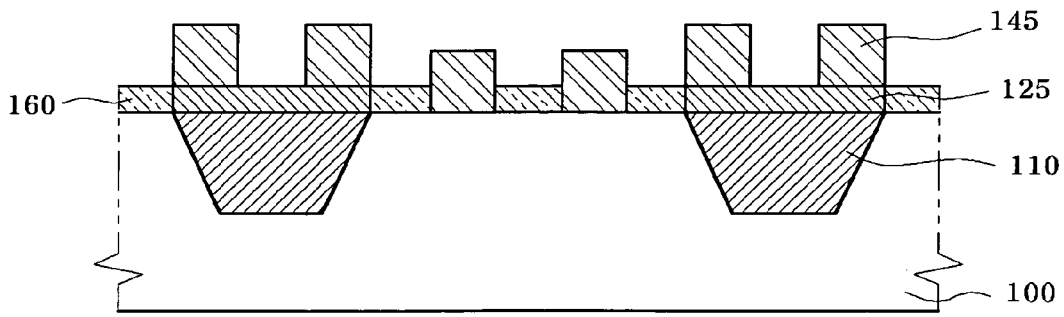

Referring to FIG. 1f, the surface of the substrate 100, formed with the hard mask 145, forms a silicon epitaxial layer 160 through selective epitaxial growth of silicon constituting the substrate surface. In this case, due to the barrier layer 125 protecting the device separating region and the hard mask 145 shielding the gate forming region, the silicon epitaxial layer 160 is restricted in its lateral growth, thereby growing upward only to a thickness of 100 to 2000 Å.

Figure 1G:
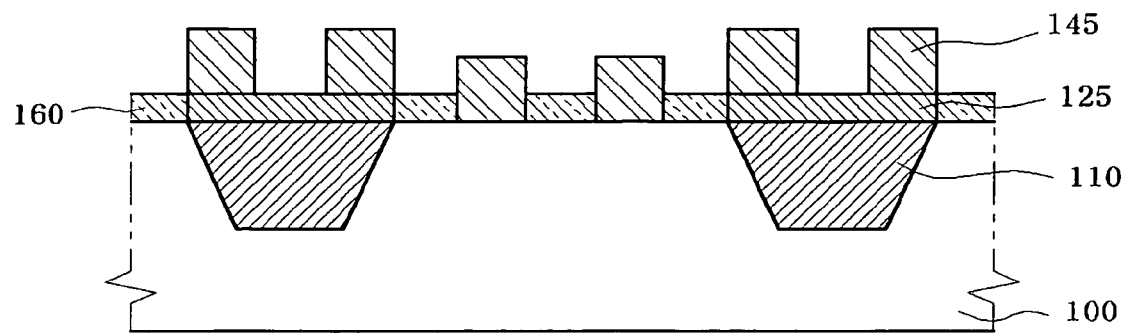

As the hard mask 145 is removed, as shown in FIG. 1g, trenches 170 having a depth of 100 to 2000 Å are formed in the active region of the substrate 100.

Figure 2:
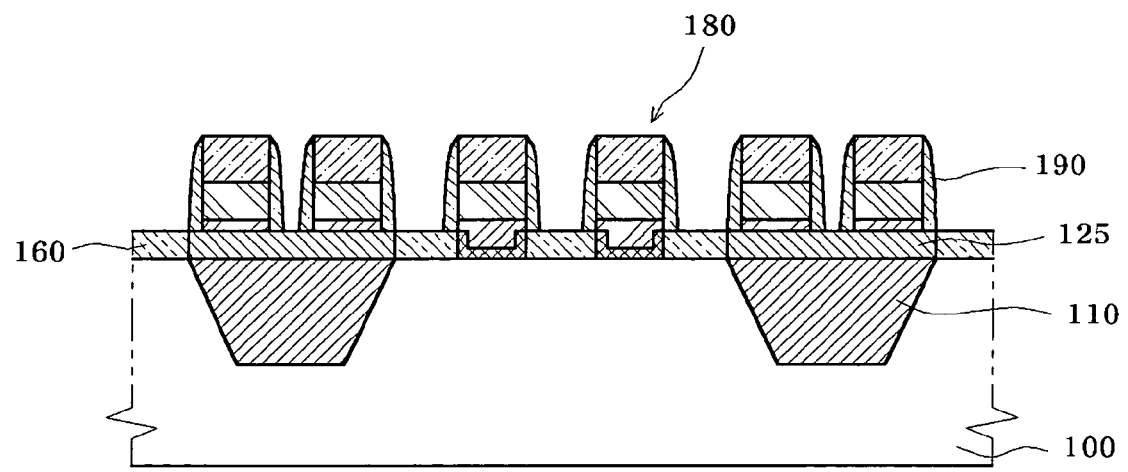
FIG. 2 is a front sectional view schematically illustrating the structure of the cell transistor manufactured by the method in accordance with the embodiment of the present invention.

Successively, a general gate forming process is performed on the device isolation region 110 and the trenches 170 of the substrate 100, thereby forming a gate pattern 180. Here, the gate pattern 180 comprises a gate oxide film, a gate electrode and a hard mask. In order to protect the resulting gate pattern 180 from certain subsequent processes, such as etching and washing processes, finally, insulating spacers 190 are formed at side walls of the gate pattern 180 (See. FIG. 2).

As stated above, in the trench forming process of the present invention, the selective epitaxial growth method is used instead of an etching method. This has the effect of preventing the generation of a pointed silicon protrusion on the substrate adjacent to the device isolation region caused by the etching method, achieving an improvement in a refresh characteristic of DRAM memory cells.

As apparent from the above description, the present invention provides a method of manufacturing a transistor cell in which trenches, which ensure the length of a gate channel, are formed by making use of a selective epitaxial growth process rather than an etching process, resulting in an improvement in a refresh characteristic of DRAM memory cells and a short-channel effect.

Further, according to the present invention, through the improvement of the short-channel effect, reduction of threshold voltage can be minimized.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a cell transistor comprising the steps of:
   a) forming a device isolation region on a silicon substrate;
   b) depositing an oxide film on the substrate formed with the device isolation region and then selectively etching the oxide film, thereby forming a barrier layer covering only the device isolation region;
   c) forming a hard mask, which defines a gate forming region, on the substrate formed with the barrier layer;
   d) forming a silicon epitaxial layer through selective epitaxial growth of silicon on a surface of the substrate, which surface is defined by the hard mask and the barrier layer; and,
   e) removing the hard mask.

2. The method according to claim 1, wherein the hard mask comprises a nitride-based material and has a thickness in a range of 100 Å to 2000 Å.

3. The method according to claim 1, wherein the silicon epitaxial layer is formed to have a thickness in a range of 100 Å to 2000 Å through selective epitaxial growth.

4. The method according to claim 1, wherein at least a portion of the hard mask is in contact with the substrate.

5. A method of manufacturing a cell transistor comprising the steps of:
   a) forming a device isolation region on a silicon substrate;
   b) depositing an oxide film on the substrate formed with the device isolation region and then selectively etching the oxide film, thereby forming a barrier layer covering only the device isolation region;
   c) forming a hard mask, which defines a gate forming region, on the substrate formed with the barrier layer;
   d) forming a silicon epitaxial layer through selective epitaxial growth of silicon on a surface of the substrate, which surface is defined by the hard mask and the barrier layer; and
   e) removing the hard mask;
   wherein the barrier layer has a thickness in a range of 100 Å to 2000 Å.

6. The method according to claim 5, wherein the hard mask comprises a nitride-based material and has a thickness in a range of 100 Å to 2000 Å.

7. The method according to claim 5, wherein the silicon epitaxial layer is formed to have a thickness in a range of 100 Å to 2000 Å through selective epitaxial growth.

8. The method according to claim 5, wherein at least a portion of the hard mask is in contact with the substrate.

9. A method of manufacturing a cell transistor comprising the steps of:
   a) forming a device isolation region on a silicon substrate;
   b) depositing an oxide film on the substrate formed with the device isolation region and then selectively etching the oxide film, thereby forming a barrier layer covering only the device isolation region;

c) forming a hard mask, which defines a gate forming region, on the substrate formed with the barrier layer;

d) forming a silicon epitaxial layer through selective epitaxial growth of silicon on a surface of the substrate, which surface is defined by the hard mask and the barrier layer; and e) removing the hard mask;

wherein the hard mask has a thickness in a range of 100 Å to 2000 Å.

10. The method according to claim 9, wherein the barrier layer has a thickness in a range of 100 Å to 2000 Å.

11. The method according to claim 9, wherein the hard mask comprises a nitride-based material.

12. The method according to claim 9, wherein the silicon epitaxial layer is formed to have a thickness in a range of 100 Å to 2000 Å through selective epitaxial growth.

13. The method according to claim 9, wherein at least a portion of the hard mask is in contact with the substrate.

14. A method of manufacturing a cell transistor comprising the steps of:

a) forming a device isolation region on a silicon substrate;

b) forming a barrier layer on the substrate formed with the device isolation region;

c) forming a hard mask, which defines a gate forming region, on the substrate formed with the barrier layer, wherein at least a portion of the hard mask is in contact with the substrate;

d) forming a silicon epitaxial layer through selective epitaxial growth of silicon on a surface of the substrate, which surface is defined by the hard mask and the barrier layer; and, e) removing the hard mask.

15. The method according to claim 14, wherein the barrier layer comprises an oxide-based material and has a thickness in a range of 100 Å to 2000 Å.

16. The method according to claim 14, wherein the hard mask comprises a nitride-based material and has a thickness in a range of 100 Å to 2000 Å.

17. The method according to claim 14, wherein the silicon epitaxial layer is formed to have a thickness in a range of 100 Å to 2000 Å through selective epitaxial growth.

* * * * *